United States Patent [19]

Alzati et al.

[11] Patent Number: 4,783,693

[45] Date of Patent: Nov. 8, 1988

[54] DRIVER ELEMENT FOR INDUCTIVE LOADS

[75] Inventors: Angelo Alzati, Bollate; Flavio Villa, Milan, both of Italy

[73] Assignee: SGS Microelettronica SpA, Catania, Italy

[21] Appl. No.: 885,503

[22] Filed: Jul. 14, 1986

[30] Foreign Application Priority Data

Jul. 16, 1985 [IT] Italy ............................ 21578 A/85

[51] Int. Cl.⁴ .................. H01L 29/72; H01L 29/48; H01L 27/10
[52] U.S. Cl. ....................................... 357/46; 357/15; 357/36
[58] Field of Search ............................ 357/15, 46, 36

[56] References Cited

U.S. PATENT DOCUMENTS

| | | |
|---|---|---|
| 3,909,700 | 9/1975 | Ferro ............................. 357/15 |
| 4,456,920 | 6/1984 | Iesaka ............................ 357/46 |
| 4,466,175 | 8/1984 | Coe ............................. 357/23.4 |
| 4,521,795 | 6/1985 | Coe et al. ....................... 357/46 |

Primary Examiner—Andrew J. James
Assistant Examiner—John Lamont
Attorney, Agent, or Firm—Guido Modiano; Albert Josif

[57] ABSTRACT

This driver element for inductive loads, specifically DC motors, step motors, solenoids, and the like comprises a transistor bridge, each transistor of the bridge being parallel connected to a respective flyback diode ensuring recirculation of the current on switching the transistors off. The diodes are of the Schottky type, so as to ensure reduced switching loss and improved reliability of the element. The Schottky diodes are formed by leaving a non-diffused portion of the collector epitaxial layer through the base and emitter regions up to the device surface so as to contact the emitter metallization layer.

2 Claims, 1 Drawing Sheet

DRIVER ELEMENT FOR INDUCTIVE LOADS

BACKGROUND OF THE INVENTION

This invention relates to a driver element for inductive loads, in particular of a type comprising bridge connected power transistors having respective protection diodes.

A known device of this type is shown, for example, in FIG. 1. This prior device comprises a bridge of four transistors designated at T1,T2,T3 and T4, and four flyback diodes, designated at D1,D2,D3 and D4, each disposed in parallel with a respective transistor. In detail, each diode is connected with its anode to the emitter of the respective transistor and with its cathode to the collector thereof. The load L is arranged at the central branch of the bridge and is flown by a current whose direction and value can be controlled through the transistors T1-T4. Between the base and the emitter of each transistor T1-T4 there is a resistor, whilst between the collector of each transistor T1-T4 and the substrate there is a substrate diode indicated at DS.

The circuit shown is effective to drive inductive loads of various types, such as DC motors, step motors, solenoids, etc., and in particular the flyback diodes D1-D4 are necessary in the recirculation phase to avoid the second reverse breakdown of the transistors.

The transistors receive their driving signal on their respective bases. It is possible to have different on and off sequences of the transistors T1-T4 with the exception of simultaneous switching on of T1 and T2 or T3 and T4. For the explanation of a typical operation it is assumed that the transistor pair T1 and T4 are off, whilst the transistor pair T2 and T3 are on, and in particular that the transistor T3 is continuously fed, whereas the transistor T2 is switching on and off. Switching on of the pair T2-T3 results in the current $I_L$ flowing through the load in the direction of the arrow in FIG. 1, thereby the current drawn by T3 is passed through the load and then discharged through T2. If T2 is switched off, the load current can no longer flow to ground and is forced to recirculate through the diode D1. At that phase, the anode voltage of D1 is higher than the cathode voltage thereof, thereby the base-emitter junction of the transistor T1 will be reverse biased. If the voltage across the diode D1 exceeds 0.6 V, then the collectorbase junction of transistor T1 is likely to be forward biased and cause the transistor T1 to be switched on in the reverse active region. This behavior is disadvantageous because, on switching the transistor T2 back on, the latter will be forced to draw both the load current $I_L$ and the switching-off current of T1 and D1. In that situation, the behavior would be as brought out by the curve I in FIG. 2, showing the current pattern versus time.

SUMMARY OF THE INVENTION

In view of the above situation, the aim underlying this invention is to provide a driver device for inductive loads which eliminates the disadvantages of the prior art, and in particular operates more rapidly in switching.

Within the above aim, it is a particular object of this invention to provide a driver device which reduces the risk of a second inverse breakdown, ensuring a more reliable operation of the device.

Another object of this invention is to provide a driver device which, thanks to its more reliable and safer operation, affords simplification of the heretofore necessary outer filtering circuitry.

A not least object of this invention is to provide a driver device of the type indicated, which can be implemented with current techniques, in a simple way and at comparable costs to prior devices.

The aim indicated, the objects outlined, and more to become apparent hereinafter, are achieved by an inductive load driver device, comprising power transistors having each emitter, base, and collector regions, and protection diodes parallel connected to said transistors and having anode and cathode regions connected respectively to said emitter and collector regions of said transistors, wherein, according to the improvements, said diodes are Schottky diodes integrated with said transistors.

BRIEF DESCRIPTION OF THE DRAWINGS

Further features and advantages will be more clearly apparent from the description of a preferred but not exclusive embodiment, shown by way of illustration but not of limitation in the accompanying drawings, where.

DESCRIPTION OF A PREFERRED EMBODIMENT

Figure 1:
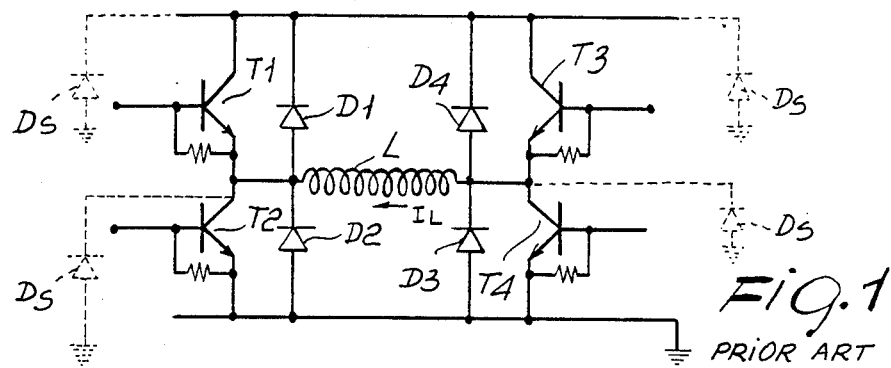
FIG. 1 is a general circuit diagram of the known application valid also for the invention.

The device according to the invention may be represented by an equivalent circuit similar to the one shown, and explained, in connection with FIG. 1, except that the diodes D1-D4 are, according to the invention, Schottky diodes. As the skilled ones will recognize, Schottky diodes have lower forward voltages thereacross and higher speeds than other diode types. Implementation of the diodes D1-D4 as Schottky diodes allows, therefore, holding between the emitter and the collector of a transistor, e.g. T1, a voltage not above 0.4 Volts, thus preventing switching on and operation in the reverse active region of the transistor. Thus operation of the device according to the invention is similar to that according to the prior art, but differs by the important fact that, for example, during the operation of the pair T2,T3, on switching off T2, the current passing through the load and recirculating through D1, causes no switching on of T1, and on switching on T2, the latter is not forced to draw the switching off current of T1. This fact, in combination with the higher switching rate of Schottky diodes, causes the current drawn by T2 following switching on, to be represented by the curve II instead of the curve I. This reduces in practice loss within the device and allows simplification of the internal or external filtering circuitry.

Figure 3:
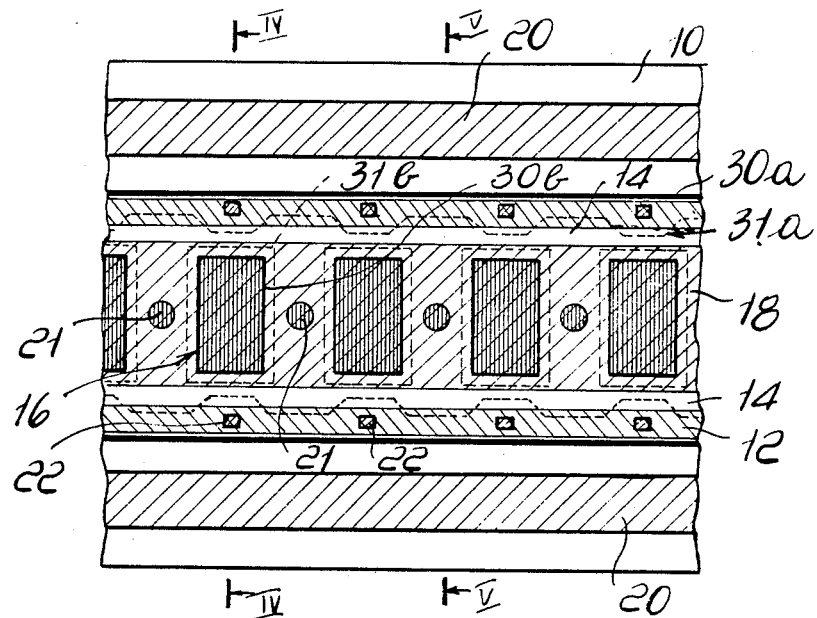
FIG. 3 is a plan view showing the layout of the device according to the invention.
Figure 4:
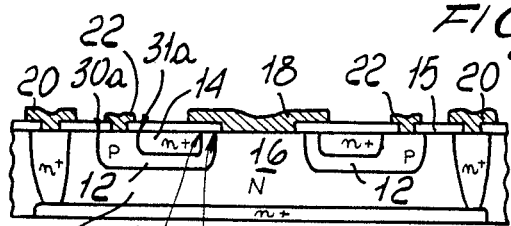
FIG. 4 shows a cross-section along the line IV—IV of FIG. 3, not in scale with the latter.
Figure 5:
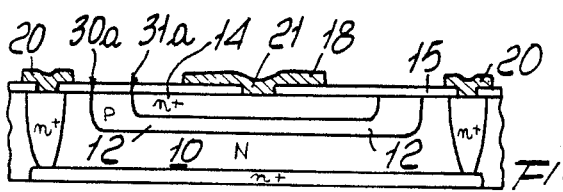
FIG. 5 shows a cross-section along line V—V of FIG. 3.
Figure 2:
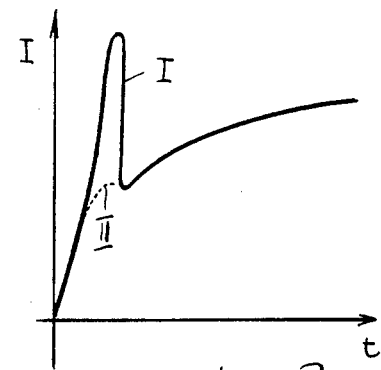
FIG. 2 shows the pattern of current versus time in the instance of the known device and of the inventive device.

An example of physical implementation of the device according to the invention is represented in FIGS. 3 to 5 showing respectively a top view and two sections through the silicon chip wherein one of the transistors and respective Schottky diode of the diagram in FIG. 1 are formed.

Making then reference to FIGS. 3 to 5, the device comprises an epitaxial layer 10 with polarity of the N type, forming the collector of the transistor and extending forwardly over the entire area accommodating the device. The epitaxial layer 10 accommodates the further regions making up the transistor and the Schottky diode. In particular, the device comprises a region 12 with polarity of the P type which forms the base region of the transistor, on the inside whereof the layer 14 with polarity of the N+ type is formed, defining the transistor emitter. As may be seen, the layers 12 and 14 are interrupted at the region 16 where the epitaxial layer 10 reaches the device surface. In practice (refer to FIG. 3) with diffusion of the layers 12 and 14 non-diffused regions or holes 16 are formed of the material of the epitaxial layer 10. Those holes or portions are metalized through a metal layer 18 also forming the emitter metalization. To this aim, above the chip surface at the region where the layers 12 and 14 are formed, that is laterally of the region 16, a layer 15 of insulating oxide has been deposited, whilst the emitter contacts 21 are formed (both before and after the hole forming the portion 16 thereby they are not visible in FIG. 4) substantially aligned to the portions 16, as pointed out in FIG. 3. The physical structure of the device is apparent from FIG. 3, where the boundary lines of the base layer have been shown by a thicker line and provided with the reference numeral 30 (30a for the outermost boundary and 30b for the innermost boundary) whilst the boundary lines of the emitter have been depicted by dashes and provided with the reference numeral 31 (31a for the outer boundary line and 31b for the inner boundary line). This figure shows further, in addition to the emitter contacts 21, also the base contacts 22 and collector contacts 20 as well as the respective metalizations.

In practice, as visible from consideration of FIGS. 3 to 5, the emitter region 14 has a substantially elongated shape with a plurality of emitter through holes (as delimited by the emitter inner boundary line 31b), while the base region 12 has a substantially elongated cup-like shape accomodating therein the emitter region (see in particular FIG. 5). As visible from FIG. 4, also the base region has through holes, here called base through holes and delimited by the innermost boundary line 30b, which are aligned with the emitter through holes; furthermore the base region has a plurality of annular portions protruding from the cup-like shape at the base through holes up to the major surface of the chip and extending within the emitter through holes, thus the annular portions and the base through holes encircle the epitaxial portions 16. As further visible in particular from FIG. 3, the insulating layer 15 has a plurality of adjacent throughgoing holes extending above the epitaxial portions 16 and above the the emitter region 14 at the portion of the emitter region which extends between adjacent emitter through holes. Thus the throughgoing holes allow direct electrical contact of the metal layer 18 on the one hand with the epitaxial portions 16 and on the other hand with the emitter region 14 (contacts 21).

As the skilled ones will recognize, the Schottky diodes are formed by the lightly doped epitaxial layer portion 16 to metal 18 junction formed in the manner described. Consequently, in a particularly simple way, the Schottky diodes are integrated in the structure of the transistors making up the device of this invention.

As visible from FIG. 3, expendiently each throughgoing hole of the insulating layer which allows electrical contact of the metal layer with the epitaxial portion 16 (Schottky diode hole) is arranged between two adjacent throughgoing holes which allow direct electrical contact of the metal 18 layer with the emitter region (emitter contact holes), or in other words each Schottky diode is formed between two emitter contacts.

The embodiment for obtaining integrated Schottky diodes is particularly advantageous on several accounts. First of all the presence of a ring with polarity of the P type around the portion 16 (formed by a part of the base 12 diffusion) allows modification of the diode depletion region and hence holding higher voltages prior to breakdown. Furthermore, the use of the emitter metalization layer as the metal constituting the Schottky diode allows this to be utilized as field plate and also ensures holding of higher voltages.

It should be noted that the hole or region 16 may have the most appropriate shapes according to necessity.

The embodiment presented also allows activation of the substrate diode DS present in the known circuit to be avoided, ensuring proper operation of the control circuits.

As may be seen from the preceding description, the invention fully achieves the objects set forth. In fact, replacement of the diodes D1-D4 with Schottky diodes causes the voltage across the transistors to be lower than 0.6-0.7 V thus preventing operation in the transistor reverse active region, ensuring a higher response speed of the device, lower dissipation and hence improved reliability of the same.

The invention herein is susceptible to many modifications and changes within the scope of the inventive concept. In particular the fact is underlined that the shape of the epitaxial region 16 constituting the Schottky diode with the emitter metalization may be any one. Furthermore, all the details may be replaced with technical equivalents thereof.

What is claimed is:

1. A driver element for inductive loads, comprising:
   an epitaxial layer of the N conductivity type defining at least one element major surface;
   a first region of the P conductivity type extending in said epitaxial layer from said element major surface;
   a second region of the N conductivity type extending from said element major surface within said first region and being surrounded thereby;
   a plurality of epitaxial portions of the N conductivity type, extending within and being surrounded by said first and second regions from said epitaxial layer to said element major surface, and
   a metal layer extending on said element major surface on and in contact with said second region and said epitaxial portions,
      said epitaxial layer, said first region and said second region respectively forming collector, base and emitter regions of an NPN transistor and said epitaxial portions and said metal layer forming respectively cathode and anode regions of Schottky diodes.

2. A driver element according to claim 1, further comprising an insulating layer interposed between said metal layer and said element major surface, second region having a substantially elongated shape with a plurality of emitter through holes, said first region having a substantially elongated cup-like shape accomodating therein said second region and including base through holes aligned with said emitter through holes, said first region including a plurality of annular portions, each said annular portion protruding from said cup-like shape at said base through holes up to said element major surface within a respective one of said emitter through holes, with each said annular portion and base through hole encircling a respective epitaxial portion, said insulating layer having a plurality of adjacent throughgoing holes extending above said epitaxial portions and above said second region between adjacent emitter through holes and defining, respectively, a plurality of Schottky diode holes, where said metal layer is in direct electrical contact with said epitaxial portions, and a plurality of emitter contact holes, where said metal layer is in direct electrical contact with said second region, each said Schottky diode hole being arranged between two adjacent emitter contact holes.

* * * * *